United States Patent
Higuchi et al.

(10) Patent No.: US 7,990,661 B2
(45) Date of Patent: Aug. 2, 2011

(54) ACTIVE SHIELD SUPERCONDUCTING ELECTROMAGNET APPARATUS AND MAGNETIC RESONANCE IMAGING SYSTEM

(75) Inventors: Yoshiya Higuchi, Tokai (JP); Mitsushi Abe, Hitachinaka (JP); Ryuya Ando, Hitachi (JP); Tsutomu Yamamoto, Hitachi (JP); Takuro Honda, Mito (JP)

(73) Assignee: Hitachi, Ltd., Tokyo (JP)

( * ) Notice: Subject to any disclaimer, the term of this patent is extended or adjusted under 35 U.S.C. 154(b) by 332 days.

(21) Appl. No.: 12/186,618

(22) Filed: Aug. 6, 2008

(65) Prior Publication Data
US 2009/0040664 A1 Feb. 12, 2009

(30) Foreign Application Priority Data
Aug. 7, 2007 (JP) ................. 2007-204909

(51) Int. Cl.
H02H 7/00 (2006.01)
H01F 6/00 (2006.01)
H01F 6/02 (2006.01)

(52) U.S. Cl. ............... 361/19; 335/216; 335/301

(58) Field of Classification Search .......... 361/19; 335/216, 301
See application file for complete search history.

(56) References Cited

U.S. PATENT DOCUMENTS

| | | | |
|---|---|---|---|
| 3,474,294 A | 10/1969 | Weaver, Jr. et al. | |
| 5,650,903 A | 7/1997 | Gross et al. | |
| 6,147,844 A | 11/2000 | Huang et al. | |
| 6,265,960 B1 * | 7/2001 | Schauwecker et al. | 335/301 |
| 6,580,346 B1 | 6/2003 | Takeshima et al. | |
| 6,717,781 B2 | 4/2004 | Xu et al. | |
| 2004/0027737 A1 | 2/2004 | Xu et al. | |
| 2004/0263165 A1 | 12/2004 | Shen et al. | |
| 2005/0231859 A1 * | 10/2005 | Huang | 361/19 |
| 2006/0227471 A1 * | 10/2006 | Tsuchiya et al. | 361/19 |

FOREIGN PATENT DOCUMENTS

| | | |
|---|---|---|
| JP | 49-45632 | 12/1974 |
| JP | 9-153408 A | 6/1997 |
| JP | 2003-197418 A | 7/2003 |

* cited by examiner

*Primary Examiner* — Jared J Fureman
*Assistant Examiner* — Scott Bauer
(74) *Attorney, Agent, or Firm* — Mattingly & Malur, PC

(57) ABSTRACT

The active shield superconducting electromagnet apparatus includes: a main switching circuit in which first and second main coils, first and second shield coils, and a first superconducting persistent current switch are connected in series; a sub switching circuit in which a bypass circuit, in which a superconducting fault current limiter and a second superconducting persistent current switch are connected in series, are connected to a series circuit of the first main coil and the second main coil in parallel; a first closed circuit in which at least one of the first main coil and the first shield coil, and a first quench protection circuit are connected in series; and a second closed circuit in which one of the second main coil and the second shield coil, and a second quench protection circuit are connected in series.

14 Claims, 8 Drawing Sheets

ACTIVE SHIELD SUPERCONDUCTING ELECTROMAGNET APPARATUS AND MAGNETIC RESONANCE IMAGING SYSTEM

The present application claims benefit of the filing date of JP 2007-204909 A filed on Aug. 7, 2007 which is incorporated herein by reference.

FIELD OF THE INVENTION

The present invention relates to an active shield superconducting electromagnet apparatus and a magnetic resonance imaging (hereinafter, referred to as MRI) system using the same.

DESCRIPTION OF THE RELATED ART

The MRI system can image a living body tissue by utilizing the fact that the nuclear magnetic resonance (hereinafter, referred to as NMR) phenomena of hydrogen nuclei of hydrogen atoms in the living body are different in each tissue of the living body, and can visualize a magnitude of the resonance, or a quickness of temporal change in the resonance, both of which are different for each tissue, as a contrast at every position in the image.

The MRI system measures an electromagnetic wave emitted by hydrogen nuclear spin by the NMR phenomenon, processes the electromagnetic wave as a signal, and thereby makes a tomogram of the living body according to a hydrogen nucleus density. In order to measure the electromagnetic wave emitted by the hydrogen nuclear spin, it is necessary to generate a static magnetic field region that has a high intensity and a high homogeneity. Therefore, a superconducting electromagnet apparatus is used to generate the static magnetic field.

As the superconducting electromagnet apparatus, JP 09-153408 A (FIG. 1) discloses an apparatus including: a pair of helium chambers which house a plurality of superconducting coils with liquid helium (He) as the refrigerant; a pair of vacuum chambers which house the helium chambers respectively; and a connection post for connecting two vacuum chambers, which are separated each other, to use the region between two vacuum chambers as an imaging region. As superconducting coils, each of the helium chambers encloses a main coil to generate a homogeneous magnetic field region that has a high intensity and a high homogeneity in the imaging region, and a shield coil to allow a current to flow in a direction reverse to that of the main coil to cancel the magnetic field so that it can suppress leakage of the magnetic field out of the imaging region and the superconducting electromagnet apparatus.

In the MRI system using the superconducting electromagnet apparatus, it is well known that variation in the outer magnetic field environment, caused by passage or stop of a vehicle in the vicinity, or up and down of an elevator, etc., can affect the magnetic field in the imaging region of the MRI system to interfere with the imaging.

However, considering the superconducting coil itself, even if variation occurs in a total amount of the magnetic field surrounded by that superconducting coil, an electromotive force should be generated to compensate for a supercurrent to keep the total amount of the magnetic field, and should result in changelessness in the total amount of the magnetic field. That is, even if a vehicle passes in the vicinity of the superconducting coil to cause a disturbance magnetic field, and even if this disturbance magnetic field crosses the superconducting coil, the supercurrent should vary to compensate for the disturbance magnetic field, and should result in little change in the total amount of the magnetic field.

In spite of the above description, in the MRI system, the magnetic field in the imaging region varies, because in the superconducting electromagnet apparatus used in the MRI system, the main coil and the shield coil are connected in series. This is a characteristic of the active shield superconducting electromagnet apparatus. Since a current in a direction reverse to, and having the same magnitude as that of the main coil, can flow through the shield coil constantly by the characteristic, a leakage of the magnetic field can be suppressed. However, since a reverse electromotive force is generated in the main coil and the shield coil when the disturbance magnetic field crosses the main coil and the shield coil connected in series, it is impossible to generate such a supercurrent as to cancel the electromotive force in the main coil and the shield coil to suppress the disturbance magnetic field.

Accordingly, a superconducting electromagnet apparatus, wherein when a superconducting wire to bypass the main coil or the shield coil is provided, and when the disturbance magnetic field crosses it, a supercurrent to compensate for the disturbance magnetic field flows through the superconducting wire to bypass the main coil or the shield coil, is proposed (see JP 64-37814 A (FIG. 1)). If a quench phenomenon occurs in the superconducting electromagnet apparatus described in JP 64-37814 A (FIG. 1), it is thought that a large current flows through the bypass superconducting wire by the electromotive force generated in the main coil and the shield coil which tends not to reduce a persistent current, and thereby the bypass superconducting wire in a normal conducting state is burned out. Accordingly, in JP 64-37814 A (FIG. 1), it is also proposed that a superconducting fault current limiter, which exhibits superconducting property when a weak current caused by the disturbance magnetic field has arisen, and which is changed to a normal conducting state immediately to generate a normal conducting resistance to limit an excessive current when a current having a greater value than a predetermined value has arisen, is connected in series to the bypass superconducting wire.

In an MRI system using a recent superconducting electromagnet apparatus, however, in order to improve the resolution of imaging, magnetomotive force is increased, and the number of turns and persistent currents in the main coil and the shield coil are also increased. Accordingly, it is thought that when the main coil or the shield coil is quenched, an unprecedented high voltage is generated between terminals of the main coil or the shield coil. This provides that, in a superconducting fault current limiter shown in JP 64-37814 A (FIG. 1), it is thought that even if the superconducting fault current limiter is changed to a normal conducting state to generate high resistance, a large current still flows through the superconducting fault current limiter, and the superconducting fault current limiter is burned out. However, it is not easy to make a superconducting fault current limiter which has a larger resistance than ever before in a normal conducting state, and functions as a superconducting wire in normal operation.

SUMMARY OF THE INVENTION

An aspect of the present invention provides an active shield superconducting electromagnet apparatus and a magnetic resonance imaging system which suppress a large current flow through a superconducting fault current limiter even if a main coil or a shield coil is quenched.

A first aspect of the present invention provides an active shield superconducting electromagnet apparatus of the present invention comprising: a main switching circuit wherein a first main coil and a second main coil which have the same excitation directions of magnetic field, a first shield coil and a second shield coil which have the excitation direction reverse to that of the first main coil, and a first superconducting persistent current switch are connected in series; a sub-switching circuit wherein a bypass circuit, wherein a superconducting fault current limiter which is changed to a normal conducting state to limit a current flow when a value of current is greater than a predetermined value, and a second superconducting persistent current switch are connected in series, is connected to a series circuit of the first main coil and the second main coil, or to a series circuit of the first shield coil and the second shield coil, in parallel; a first closed circuit wherein at least one of the first main coil and the first shield coil, and a first quench protection circuit, through which a current does not flow in the absence of potential difference between both ends of which, and through which a current flows in the presence of potential difference between both ends of which, are connected in series; and a second closed circuit wherein at least one of the second main coil and the second shield coil, and a second quench protection circuit, through which a current does not flow in the absence of potential difference between both ends of which, and through which a current flows in the presence of potential difference between both ends of which, are connected in series.

A second aspect of the present invention provides a magnetic resonance imaging system having a gap which is at atmospheric pressure and normal temperature, is disposed between the first main coil and the second main coil, and is used as an imaging region.

A third aspect of the present invention provides an active shield superconducting electromagnet apparatus and a MRI system, in which even if a main coil or a shield coil is quenched, a large current flow through a superconducting fault current limiter is suppressed.

BRIEF DESCRIPTION OF THE DRAWINGS

The object and features of the present invention will become more readily apparent from the following detailed description taken in conjunction with the accompanying drawings in which.

DETAILED DESCRIPTION OF THE INVENTION

Referring to FIGS. 1-8, embodiments of the present invention will be explained in detail below. In FIGS. 1-8, like references designate identical or similar components.

First Embodiment

Figure 1:
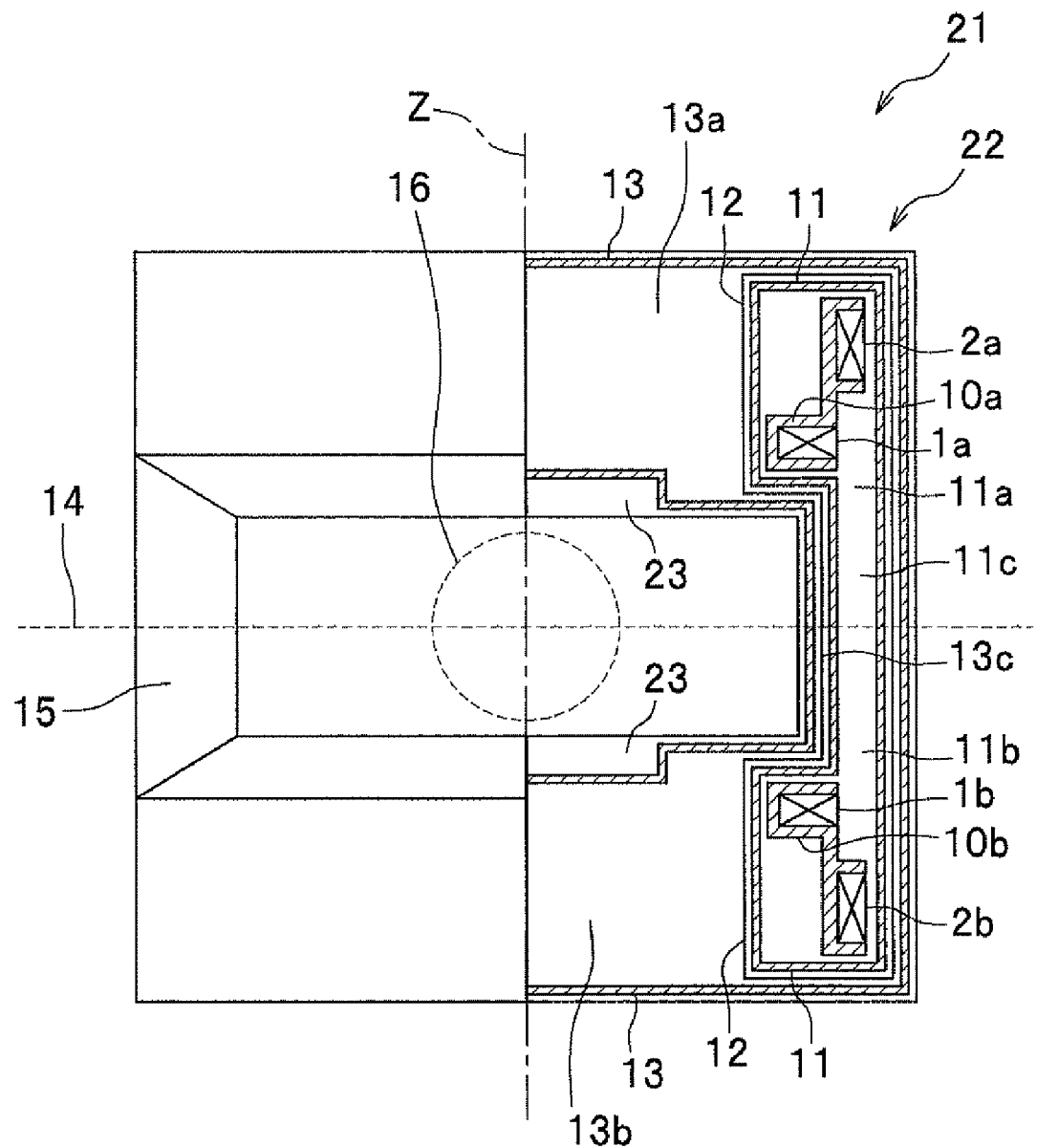
FIG. 1 is a side and sectional view of a nuclear magnetic resonance imaging system according to a first embodiment of the present invention.

FIG. 1 shows a left side view of a nuclear magnetic resonance imaging (MRI) apparatus according to the first embodiment of the present invention on the left, and shows a right sectional view of the MRI system on the right. As shown in FIG. 1, the MRI system 21 of open-type is exemplified. The open-type MRI system includes an active shield superconducting electromagnet apparatus 22 and an inspection apparatus arrangement region 23.

The superconducting electromagnet apparatus 22 includes a pair of main coils 1a and 1b and a pair of shield coils 2a and 2b. Each of the pair of main coils 1a and 1b is symmetrically arranged with an equatorial plane 14 as a symmetric plane, and each central axis of those coincides with each other. To coincide with these central axes, a Z-axis, which is perpendicular to the equatorial plane 14, may be provided. The main coils 1a and 1b can generate a main magnetic field in the same Z-axis direction as that of the homogeneous magnetic field generated in an imaging region 16. The imaging region 16 is at equal distances from the pair of main coils 1a and 1b on the Z-axis. The pair of shield coils 2a and 2b is also symmetrically arranged with the equatorial plane 14, and each central axis of those coincides with a main central axis, namely, the Z-axis. The first shield coil 2a lies adjacent to the first main coil 1a, generates a magnetic field in a direction reverse to that of the first main coil 1a, and reduces a leakage magnetic field out of the superconducting electromagnet apparatus 22. The second shield coil 2b is adjacent to the second main coil 1b, generates a magnetic field in a direction reverse to that of the second main coil 1b, and reduces a leakage magnetic field out of the superconducting electromagnet apparatus 22.

The main coils 1a and 1b, and the shield coils 2a and 2b fit their axes to the Z-axis so as to be arranged on the Z-axis in order of the first shield coil 2a, the first main coil 1a, the second main coil 1b, and the second shield coil 2b from up to down. The main coils 1a and 1b are arranged at a position which is more proximal to the imaging region 16 than a position at which the shield coils 2a and 2b are arranged. The imaging region 16 is provided in a space between the first main coil 1a and the second main coil 1b. The superconducting electromagnet apparatus 22 is a so-called vertical magnetic field open-type magnet.

At the upper portion of the superconducting electromagnet apparatus 22, a first bobbin 10a, around and by which the first main coil 1a and the first shield coil 2a are wound and supported, is provided. In the form paired with the first bobbin 10a, at the lower portion of the superconducting electromagnet apparatus 22, a second bobbin 10b, around and by which the second main coil 1b and the second shield coil 2b are wound and supported, is provided.

The superconducting electromagnet apparatus 22 comprises a helium container 11 which encloses the pair of main coils 1a and 1b, the pair of shield coils 2a and 2b, and the pair of bobbins 10a and 10b along with a refrigerant; a thermal radiation shield 12 which encloses the helium container 11 and intercepts thermal radiation thereinto; and a vacuum vessel 13 which encloses the helium container 11 and the thermal radiation shield 12 and keeps the vacuum therein. As the refrigerant, liquid helium (He), or in some cases, liquid nitrogen ($N_2$) can be used.

If the superconducting electromagnet apparatus 22 is placed in a room at room temperature, the heat in the room cannot be conducted to the helium container 11 by conduction or convection since the vacuum is kept in the vacuum vessel 13. Also, by the thermal radiation shield 12, the heat in the room cannot be conducted from the vacuum vessel 13 to the helium container 11 by radiation. The pair of main coils 1a and 1b, the pair of shield coils 2a and 2b, and the pair of bobbins 10a and 10b can be set stably at a very low temperature which is the temperature of the refrigerant.

The helium container 11 comprises: a first helium chamber 11a which encloses the first main coil 1a, the first shield coil 2a, and the first bobbin 10a; a second helium chamber 11b which encloses the second main coil 1b, the second shield coil 2b, and the second bobbin 10b, and is spaced apart from the first helium chamber 11a; and a helium connecting tube 11c which connects the first helium chamber 11a and the second helium chamber 11b. The helium connecting tube 11c is arranged about the outer circumference of the first helium chamber 11a and the second helium chamber 11b. The number of the helium connecting tube 11c may be one, or as shown in FIG. 1, may be more than one.

The vacuum vessel 13 comprises a first vacuum chamber 13a which encloses the first helium chamber 11a; a second vacuum chamber 13b which encloses the second helium chamber 11b, and is spaced apart from the first vacuum chamber 13a; and a vacuum connecting tube 13c which connects the first vacuum chamber 13a and the second vacuum chamber 13b, and encloses the helium connecting tube 11c. The vacuum connecting tube 13c is arranged around the outside of the first vacuum chamber 13a and the second vacuum chamber 13b. The number of the vacuum connecting tube 13c may be one, or as shown in FIG. 1, may be more than one.

The MRI system 21 can generate a homogeneous magnetic field in the imaging region 16 by constant current flow through the pair of main coils 1a and 1b in the same direction, and by constant current flow through the pair of shield coils 2a and 2b in the direction reverse to that of the main coils 1a and 1b. Between the first main coil 1a and the second main coil 1b, a gap, which is at atmospheric pressure and normal temperature, is provided, and this gap is used as the imaging region 16. That is, since the imaging region 16 is positioned between the first vacuum chamber 13a and the second vacuum chamber 13b, and can be kept at room temperature and atmospheric pressure, a patient can lie down so that his/her inspected region settles into the imaging region 16. Since, in order to be inspected, the patient is positioned between the upper first vacuum chamber 13a and the lower second vacuum chamber 13b, which are spaced apart by the vacuum connecting tube 13c (connection post 15), the patient's sight is open (not closed). Therefore, the open-type MRI system 21 is popular with patients.

On the opposed surfaces of the first vacuum chamber 13a and the second vacuum chamber 13b of the superconducting electromagnet apparatus 22, inspection apparatus arrangement regions 23 are provided respectively. While not shown in the drawings, at the inspection apparatus arrangement region 23, there are a gradient magnetic field coil which varies a magnetic field spatially in the form of being superimposed on the homogeneous magnetic field in the imaging region 16 to obtain positional information; a radio frequency irradiation coil which applies electromagnetic wave having a resonance frequency to cause NMR phenomenon; and an iron material to adjust the magnetic field to improve the homogeneity of the homogeneous magnetic field in the imaging region 16.

The MRI system 21 measures a nuclear magnetic resonance signal emitted by hydrogen nuclear spin by a NMR phenomenon, processes the signal, and thereby makes a tomogram of an inside of a patient body according to a hydrogen nucleus density. At the time of measuring, in the imaging region 16 into which the patient settles, a static magnetic field which has a high intensity (not less than 0.3 T) and a high homogeneity (on the order of 10 ppm) is generated. In order to obtain positional information in the imaging region 16, a pair of the upper and lower gradient magnetic field coils of the imaging region 16 apply a spatially-varied gradient magnetic field to the imaging region 16. Further, a pair of upper and lower radio frequency irradiation coils of the imaging region 16 applies an electromagnetic wave having a resonance frequency to cause NMR phenomenon to the imaging region 16. These provide that a nuclear magnetic resonance signal discharged by a hydrogen nuclear spin is measured in every micro region within the imaging region 16, the nuclear magnetic resonance signal is processed, and thereby a tomogram of the inside of a patient body is made according to a hydrogen nucleus density.

Figure 2:
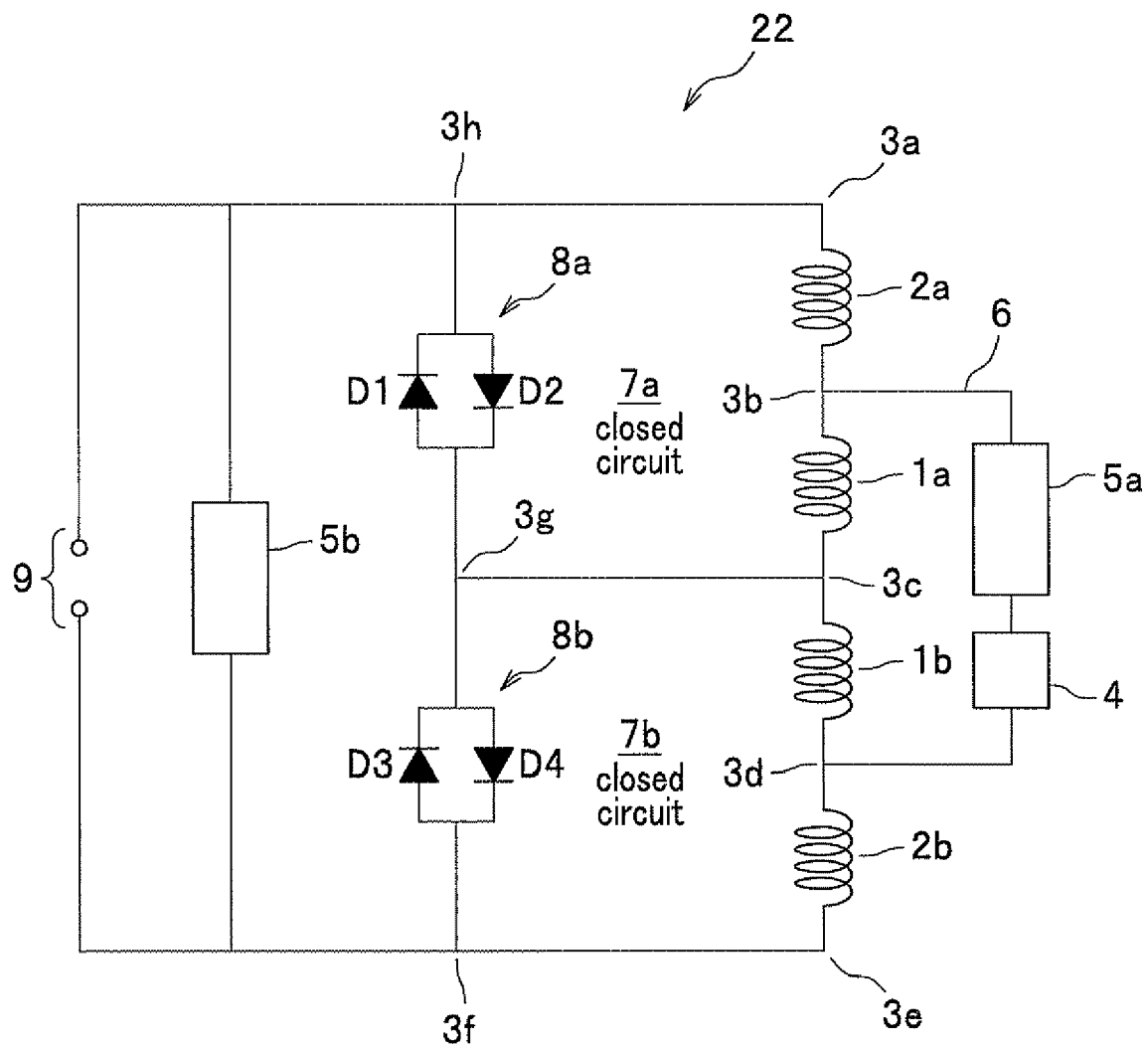
FIG. 2 is a schematic circuit diagram of an active shield superconducting electromagnet apparatus according to the first embodiment of the present invention.

FIG. 2 is a schematic circuit diagram of the active shield superconducting electromagnet apparatus 22 according to a first embodiment of the present invention. The superconducting electromagnet apparatus 22 comprises a main switching circuit wherein a first main coil 1a and a second main coil 1b which have the same excitation directions of magnetic field, a first shield coil 2a and a second shield coil 2b which have the excitation direction reverse to that of the first main coil 1a, and a first superconducting persistent current switch 5b are connected in series. More concretely, the main switching circuit includes a closed circuit wherein the first superconducting persistent current switch 5b—node 3h—node 3a—the first shield coil 2a—node 3b—the first main coil 1a—node 3c—the second main coil 1b—node 3d—the second shield coil 2b—node 3e—node 3f—the first superconducting persistent current switch 5b are connected in the above order, and the first superconducting persistent current switch 5b can open/close this closed circuit. Terminals of an excitation power supply 9 are connected to the first superconducting persistent current switch 5b in parallel. Further, all wires of the main switching circuit are made of superconducting wires.

The first main coil 1a and the second main coil 1b generate a magnetic field that has a high intensity and a greater homogeneity than a predetermined level in the imaging region 16 (see FIG. 1). The first shield coil 2a and the second shield coil 2b allow a current to flow in the direction reverse to that of the first main coil 1a and the second main coil 1b, and suppress a leakage of magnetic field, which is generated from the first main coil 1a and the second main coil 1b, out of the vacuum vessel 13 (see FIG. 1). These first main coil 1a, second main coil 1b, first shield coil 2a, and second shield coil 2b are connected in series as shown in FIG. 2. Each of these first main coil 1a, second main coil 1b, first shield coil 2a, and second shield coil 2b may comprise a plurality of coils.

Also, the superconducting electromagnet apparatus 22 comprises a bypass circuit 6 wherein a superconducting fault current limiter 4 which is changed to a normal conducting state to limit a current flow when a value of current is greater than a predetermined value, and a second superconducting persistent current switch 5a are connected in series. All of wires of the bypass circuit 6 are also made of superconducting wires. The bypass circuit 6 is connected to a series circuit of the first main coil 1a and the second main coil 1b, or a series circuit (not shown) of the first shield coil 2a and the second shield coil 2b, in parallel. As a result, a sub-switching circuit is made up. More concretely, the sub-switching circuit is a closed circuit wherein the second superconducting persistent current switch 5a—the superconducting fault current limiter 4—node 3d—the second main coil 1b-node 3c—the first main coil 1a—node 3b—the second superconducting persistent current switch 5a are connected in the above order, and the second superconducting persistent current switch 5a can open/close this closed circuit.

Also, the superconducting electromagnet apparatus 22 comprises a first closed circuit 7a and a second closed circuit 7b. The first closed circuit 7a is made up by connecting the first main coil 1a, the first shield coil 2a, and a first quench protection circuit 8a, through which a current does not flow in the absence of potential difference between both ends of which, and through which a current flows in the presence of potential difference between both ends of which, in series. More concretely, first closed circuit 7a is made up by connecting the first main coil 1a—node 3c—node 3g—the first quench protection circuit 8a—node 3h—node 3a—the first shield coil 2a—node 3b—the first main coil 1a in the above order. The first quench protection circuit 8a comprises a parallel circuit which includes anti-parallel first and second diodes D1 and D2.

The second closed circuit 7b is made up by connecting the second main coil 1b, the second shield coil 2b, and a second quench protection circuit 8b, through which a current does not flow in the absence of potential difference between both ends of which, and through which a current flows in the presence of potential difference between both ends of which, in series. More concretely, second closed circuit 7b is made up by connecting the second main coil 1b—node 3d—the second shield coil 2b—node 3e—node 3f—the second quench protection circuit 8b—node 3g—node 3c—second main coil 1b in the above order. The second quench protection circuit 8b comprises a parallel circuit which includes anti-parallel third and fourth diodes D3 and D4.

Next, the operation of the superconducting electromagnet apparatus 22 will be explained.

First, the first superconducting persistent current switch 5b and the second superconducting persistent current switch 5a are turned off, and a power supply (not shown), which is connected to the excitation power supply terminals 9, supplies power to the first main coil 1a, the second main coil 1b, the first shield coil 2a, and the second shield coil 2b until a rated current flows through the main switching circuit. After the rated current flows, the first superconducting persistent current switch 5b is turned on. Next, the power supply is removed from the excitation power supply terminals 9. The superconducting electromagnet apparatus 22 is changed to a persistent current mode wherein a persistent current flows. Further, an electrical resistance (including a wire resistance) of the main switching circuit, through which the persistent current flows, becomes zero (0).

Next, the second superconducting persistent current switch 5a is turned on. When the second superconducting persistent current switch 5a is turned on, though an electrical resistance (including a wire resistance) of the bypass circuit 6 becomes zero (0), the persistent current flowing through the main switching circuit does not flow into the bypass circuit 6. This is because each of the first main coil 1a, the second main coil 1b, the first shield coil 2a, and the second shield coil 2b tends to allow a constant persistent current to flow. If a part of the persistent current flows through the bypass circuit 6, at any one of the first main coil 1a, the second main coil 1b, the first shield coil 2a, and the second shield coil 2b, the persistent current reduces, and it becomes impossible for the constant persistent current to flow. Because of this, the persistent current flowing through the main switching circuit does not flow into the bypass circuit 6.

On the other hand, when a disturbance magnetic field (not shown) comes into the first main coil 1a, the second main coil 1b, the first shield coil 2a, and the second shield coil 2b, in order to prevent the total amount of the magnetic field from varying, a supercurrent to compensate for the disturbance magnetic field is superimposed on the persistent current, and flows through the first main coil 1a, the second main coil 1b, the first shield coil 2a, and the second shield coil 2b. And, if a supercurrent tends to flow into another coil than the first main coil 1a, the second main coil 1b, the first shield coil 2a, and the second shield coil 2b, this supercurrent flows into the bypass circuit 6, because each of the coils tends to allow a constant current to flow.

Further, since an electromotive force generated by the disturbance magnetic field is so small that a voltage not less than an on-voltage of the diodes D1 and D2 is not applied to the first closed circuit 7a, the diodes D1 and D2 do not become conducting. As a result, a current circulating through the first closed circuit 7a via the first quench protection circuit 8a comprising a pair of bidirectional diodes is not generated. Similarly, since a voltage, which is not less than an on-voltage of the diodes D3 and D4, is not applied to the second closed circuit 7b, the diodes D3 and D4 do not become conducting. As a result, a current circulating through the second closed circuit 7b via the second quench protection circuit 8b comprising a pair of bidirectional diodes and is not generated.

Figure 3A:
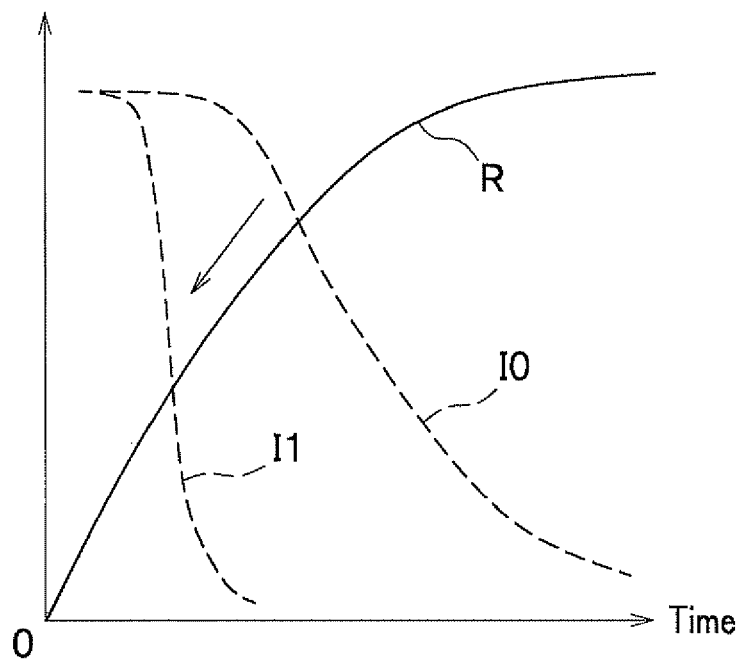
FIG. 3A is a graph of time varying sum of electrical resistances of each of the first main coil, the second main coil, the first shield coil, and the second shield coil, and a time varying persistent current flowing through the first main coil, the second main coil, the first shield coil, and the second shield coil at the beginning of quench.
Figure 3B:
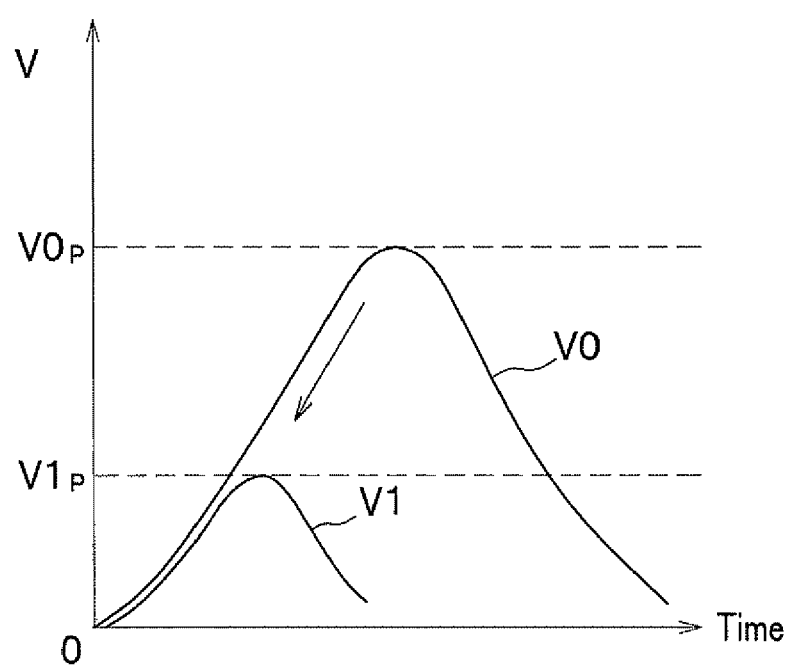
FIG. 3B is a graph of time variation sum of voltage generated at each of the first main coil, the second main coil, the first shield coil, and the second shield coil at the beginning of quench.

Next, an operation will be described where the first main coil 1a, the second main coil 1b, the first shield coil 2a, and the second shield coil 2b are quenched in the superconducting electromagnet apparatus 22. First, a comparative example will be described where the first quench protection circuit 8a and the second quench protection circuit 8b are omitted so that the first closed circuit 7a and the second closed circuit 7b are not made up. Due to the mechanical disturbance, etc., when heat is generated at a part of the first main coil 1a, the second main coil 1b, the first shield coil 2a, and the second shield coil 2b, the superconductivity around the portion breaks down, an electrical resistance R appears as shown in FIG. 3A, and a persistent current I0 causes Joule heat. This increases the normal conducting region, increases the electrical resistance R, expands the normal conducting state part in all of the first main coil 1a, the second main coil 1b, the first shield coil 2a, and the second shield coil 2b, and results in a so-called quench condition. When this normal conducting region is expanded, two kinds of voltages described below are generated at each of the coils 1a, 1b, 2a, and 2b. One is a resistance voltage VR (=R*I0) given by the product of the resistance R, which is generated and increased by expansion of the normal conducting region, and the persistent current I0. The other is an induced voltage VL (=−L*dI0/dt) generated by the time variation in the persistent current I0. First, at the beginning of quench, the resistance voltage VR at any of coils 1a, 1b, 2a, and 2b, each of which may be a starting point of quench, increases largely, thereby decreasing the persistent current I0 and increasing the induced voltage VL. Because the induced voltage VL is superimposed on the resistance voltage VR, as shown in FIG. 3B, a voltage V0 generated at each of coils 1a, 1b, 2a, and 2b provides a maximum voltage V0p after a certain time from quench generation.

By generation of this maximum voltage V0p, a voltage of several thousand volts is applied to the bypass circuit 6. This changes the superconducting fault current limiter 4 to a normal conducting state immediately to generate a resistance which limits an excessive current. However, for example, although a resistance of 1 kΩ can be generated, the superconducting fault current limiter 4 may be burned out because several amperes of current flows when the voltage of several thousand volts is applied. Therefore, it is necessary to reduce the current flowing through this bypass circuit 6 to a fraction of its original value, and further to reduce the maximum voltage V0p applied to the bypass circuit 6 to a fraction of its original value.

Next, an operation will be described where the first quench protection circuit 8a and the second quench protection circuit 8b are added so that the first closed circuit 7a and the second closed circuit 7b are made up in the superconducting electromagnet apparatus 22. At the beginning of quench, heat is generated at a part of the coils 1a, 1b, 2a, and 2b, the superconductivity breaks down, an electrical resistance R appears, and a resistance voltage VR given by the product of the electrical resistance R and the persistent current I0 is generated. Since a resistance voltage VR, which is not less than on-voltage (from a few tenth to a few volts), is applied to either diode D1 or diode D2, or diode D3 or diode D4, of a pair of bidirectional diodes of the first quench protection circuit 8a or the second quench protection circuit 8b, a current flows through any one of the diodes D1-D4. Namely, the current flows through the first closed circuit 7a and the second closed circuit 7b. This current is divided from the persistent current. Since each of the first closed circuit 7a and the second closed circuit 7b comprises two coils, the inductance L of the circuit is smaller than that of the main switching circuit having four coils connected in series. Also, since a pair of the first main coil 1a and the first shield coil 2a, winding directions of which are reversed, are used in the first closed circuit 7a, a mutual inductance between the first main coil 1a and the first shield coil 2a can be reduced. That is, the inductances cancel each other, and a sum of inductances L can be reduced. Similarly, in the second closed circuit 7b, since a pair of the second main coil 1b and the second shield coil 2b, winding directions of which are reversed, are used, a mutual inductance between the second main coil 1b and the second shield coil 2b can be reduced. That is, the inductances cancel each other, and a sum of inductances L can be reduced. Since the inductance L is reduced, it becomes difficult for an electromotive force to be generated in the coils 1a, 1b, 2a, and 2b to resist a current decay, and the decay of the persistent current is no longer prevented. And, as shown in a persistent current I1 in FIG. 3A, the persistent current I1 can be decayed faster than the persistent current I0. In the coils 1a, 1b, 2a, and 2b at which quench begins, the values of maximum voltages V0p and V1p depend on the relationship between a growth rate of resistance R and decay rates of persistent currents I0 and I1. That is, when the decay rate of persistent current I1 is greater than the growth rate of resistance R, a maximum voltage V1p of resistance voltage V1, which is a product of the resistance R and the persistent current I1, is smaller than the maximum voltage V0p. This provides that the voltage applied to both ends of the bypass circuit 6 is reduced to a fraction of its original value. As described above, according to the first embodiment, the active shield superconducting electromagnet apparatus 22 capable of suppressing a large current flowing through the superconducting fault current limiter 4 although a quench phenomenon occurs in the main coils 1a, 1b, or the shield coils 2a, 2b, is provided.

Second Embodiment

Figure 4:
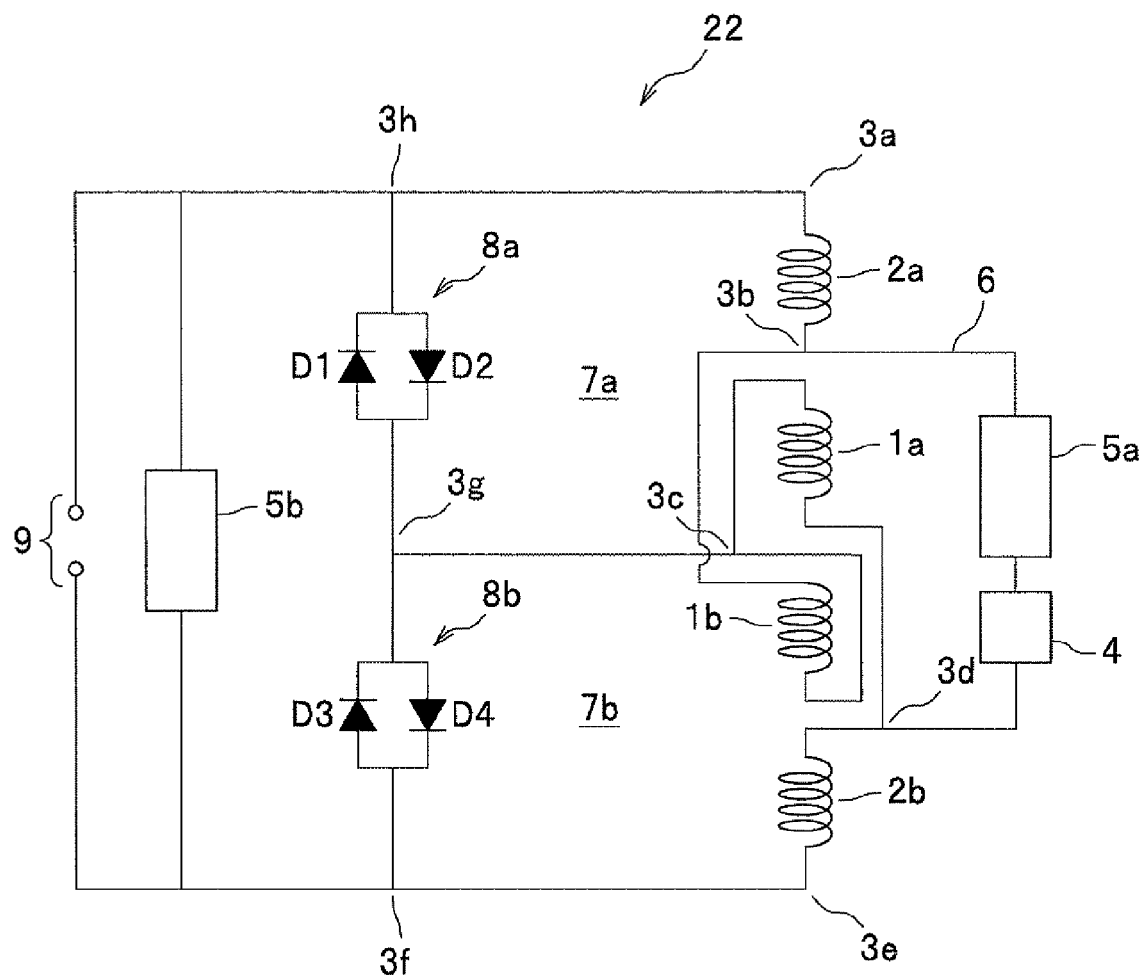
FIG. 4 is a schematic circuit diagram of an active shield superconducting electromagnet apparatus according to the second embodiment of the present invention.

FIG. 4 is a schematic circuit diagram of the active shield superconducting electromagnet apparatus 22 according to a second embodiment of the present invention. As shown in FIG. 4, the superconducting electromagnet apparatus 22 according to the second embodiment of the present invention differs from the superconducting electromagnet apparatus 22 of the first embodiment in that the first main coil 1a, the second main coil 1b, the first shield coil 2a, and the second shield coil 2b are connected in series in order of the first shield coil 2a, the second main coil 1b, the first main coil 1a, and the second shield coil 2b. Further, like the first embodiment, coils are arranged on the Z-axis in order of the first shield coil 2a, the first main coil 1a, the second main coil 1b, and the second shield coil 2b from up to down as shown in FIG. 1.

By this difference, the first closed circuit 7a is made up to include the second main coil 1b instead of the first main coil 1a. Also, the second closed circuit 7b is made up to include the first main coil 1a instead of the second main coil 1b. More concretely, the first closed circuit 7a includes the first shield coil 2a—node 3b—the second main coil 1b—node 3c—node 3g—the first quench protection circuit 8a—node 3h—node 3a—the first shield coil 2a which are connected in the above order. The second closed circuit 7b includes the second shield coil 2b—node 3e—node 3f—the second quench protection circuit 8b—node 3g—node 3c—the first main coil 1a-node 3d—the second shield coil 2b which are connected in the above order.

Next, the effect of these connections will be explained. In a plurality of coils comprising the first main coil 1a, the second main coil 1b, the first shield coil 2a, and the second shield coil 2b, when any one of the coils begins to be quenched, it is necessary to allow the quench phenomenon to propagate through all of coils 1a, 1b, 2a, and 2b as soon as possible to disperse the consumption of electromagnetic energy (heat generation). This is because if the consumption of electromagnetic energy (heat generation) concentrates on one coil, the temperature of the coil more rises beyond the tolerance level of the coil, causing the coil to be damaged. Since dispersing the consumption of electromagnetic energy (heat generation) over all of coils 1a, 1b, 2a, and 2b increases the total electrical resistance of all coils 1a, 1b, 2a, and 2b without temperature rise beyond the tolerance level of the coil, the decay of the persistent current can be promoted. This provides the effect that the rise in the resistance voltage V1 of the coil which begins to be quenched is suppressed (see FIG. 3B), and that the maximum voltage V1p is reduced. In order to allow the quench phenomenon to propagate, it is effective to reinforce the electromagnetic coupling among the coils 1a, 1b, 2a, and 2b, or to include the coils 1a, 1b, 2a, and 2b spaced apart from each other in the first closed circuit 7a and the second closed circuit 7b so that a current changing affects the spaced-apart coils.

There are two methods described below to allow the quench phenomenon to propagate. In one method, a quench-back heater is used. In the other method, coils are moved toward each other to provide a current changing by an electromagnetic induction, or a current changing is provided in the coils of a series circuit (of the first closed circuit 7a, and the second closed circuit 7b) wherein coils are connected in series, and wherein the current is common, thereby a magnetic field to which the coils are exposed is changed, an alternating-current loss is generated in superconducting wires of unquenched coils, and the quench phenomenon is allowed to propagate and to be induced. In the latter case, since the quench-back heater is not used, it is possible to reduce the cost, and since any foreign matter is not attached to the superconducting coil, it is possible to improve the reliability.

In order to provide current changing in coils by an electromagnetic induction, it is necessary to reinforce the electromagnetic coupling between the coils. The electromagnetic coupling between the coils is determined by the sizes of coils and arrangement (distance between coils). In the case of an MRI system, etc., since the arrangement of coils is strictly determined to realize a homogeneous magnetic field, it is impossible to change sizes and arrangement of coils only to change the electromagnetic coupling. On the other hand, it is possible to determine which the of coils is included in the first closed circuit 7a or the second closed circuit 7b with only a change in wiring between coils, without change the in sizes and arrangement of coils.

More concretely, in the superconducting electromagnet apparatus 22, as shown in FIG. 1, a pair of the first shield coil 2a and the first main coil 1a are spaced apart from a pair of the second main coil 1b and the second shield coil 2b, and the electromagnetic coupling between them is weak. The first shield coil 2a is spatially close to the first main coil 1a, and the electromagnetic coupling is strong. The second main coil 1b is spatially close to the second shield coil 2b, and the electromagnetic coupling is strong. Accordingly, as shown in FIG. 4, the first closed circuit 7a is made up to include the first shield coil 2a and the second main coil 1b. The second closed circuit 7b is made up to include the first main coil 1a and the second shield coil 2b. This provides that, for example, when the first shield coil 2a is quenched, a current changing immediately occurs in the second main coil 1b the current of which is common to the first shield coil 2a, and the quench phenomenon is allowed to propagate and to be induced in the second main coil 1b by the above described alternating-current loss. Further, the quench in the first shield coil 2a is allowed to propagate to the first main coil 1a having strong electromagnetic coupling to the first shield coil 2a. In the second shield coil 2b, the quench phenomenon is allowed to propagate via two routes, namely, a current changing in the second closed circuit 7b caused by the quenched first main coil 1a, and an electromagnetic coupling caused by the quenched second main coil 1b. As described above, the quench phenomenon is allowed to propagate over all of the coils 1a, 1b, 2a, and 2b. As a result, since the electrical resistance increases in all of the coils 1a, 1b, 2a, and 2b to promote the decay of the persistent current, the resistance voltage of the coil at which quench begins can be suppressed, and the current flowing through the superconducting fault current limiter 4 in the bypass circuit 6 can be reduced.

Third Embodiment

Figure 5:
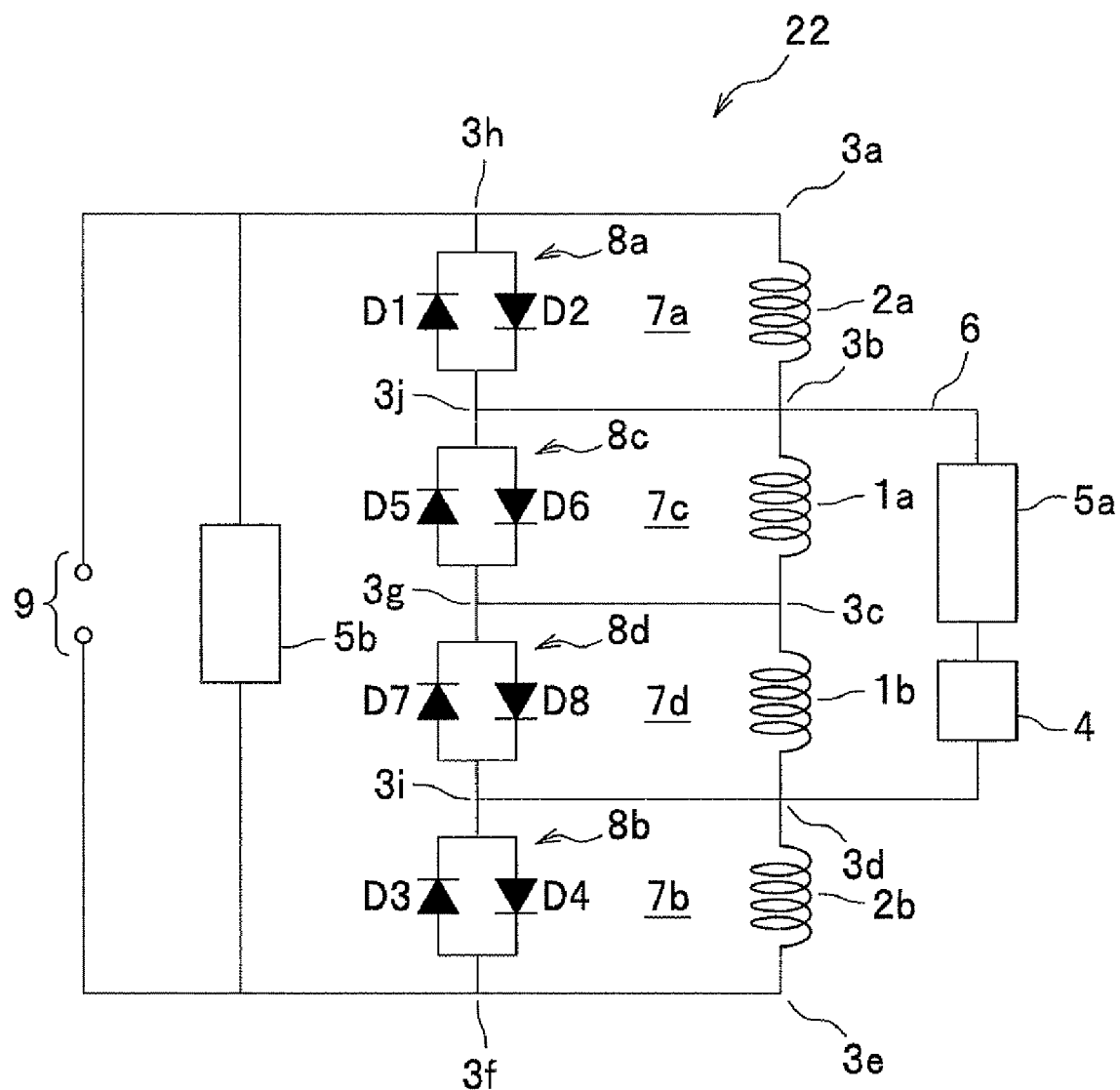
FIG. 5 is a schematic circuit diagram of an active shield superconducting electromagnet apparatus according to the third embodiment of the present invention.

FIG. 5 is a schematic circuit diagram of the active shield superconducting electromagnet apparatus 22 according to a third embodiment of the present invention. As shown in FIG. 5, the superconducting electromagnet apparatus 22 according to the third embodiment of the present invention differs from the superconducting electromagnet apparatus 22 of the first embodiment in that quench protection circuits 8a-8d are individually provided for the first shield coil 2a, the first main coil 1a, the second main coil 1b, and the second shield coil 2b.

By connecting the first shield coil 2a, and a first quench protection circuit 8a, through which a current does not flow in the absence of potential difference between both ends of which, and through which a current flows in the presence of potential difference between both ends of which, in series, the first closed circuit 7a is made up. More concretely, the first closed circuit 7a is made up by connecting the first shield coil 2a—node 3b—node 3j—the first quench protection circuit 8a—node 3h—node 3a—the first shield coil 2a in the above order. Further, the first quench protection circuit 8a comprises a parallel circuit which includes anti-parallel first and second diodes D1 and D2.

By connecting the first main coil 1a, and a third quench protection circuit 8c, through which a current does not flow in the absence of potential difference between both ends of which, and through which a current flows in the presence of potential difference between both ends of which, in series, a third closed circuit 7c is made up. More concretely, third closed circuit 7c is made up by connecting the first main coil 1a—node 3c—node 3g—the third quench protection circuit 8c—node 3j—node 3b—the first main coil 1a in the above order. Further, the third quench protection circuit 8c comprises a parallel circuit which includes anti-parallel fifth and sixth diodes D5 and D6.

By connecting the second main coil 1b, and a fourth quench protection circuit 8d, through which a current does not flow in the absence of potential difference between both ends of which, and through which a current flows in the presence of potential difference between both ends of which, in series, a fourth closed circuit 7d is made up. More concretely, fourth closed circuit 7d is made up by connecting the second main coil 1b—node 3d—node 3i—the fourth quench protection circuit 8d—node 3g—node 3c—the second main coil 1b in the above order. Further, the fourth quench protection circuit 8d comprises a parallel circuit which includes anti-parallel seventh and eighth diodes D7 and D8.

By connecting the second shield coil 2b, and a second quench protection circuit 8b, through which a current does not flow in the absence of potential difference between both ends of which, and through which a current flows in the presence of potential difference between both ends of which, in series, a second closed circuit 7b is made up. More concretely, second closed circuit 7b is made up by connecting the second shield coil 2b—node 3e—node 3f—the second quench protection circuit 8b—node 3i—node 3d—the second shield coil 2b in the above order. Further, the second quench protection circuit 8b comprises a parallel circuit which includes anti-parallel third and fourth diodes D3 and D4.

According to the third embodiment, as compared to the first embodiment, the inductance L per one of the closed circuits 7a-7d decreases, and at the beginning of quench, the persistent current can be decayed easily. Also, since a potential difference between both ends of each of the coils 1a, 1b, 2a, and 2b is determined by the on-voltage of the diodes D1-D8 respectively, the potential difference between both ends is no more than 10 volts. Even if one coil is quenched, a current changing occurs in a closed circuit which includes the coil. However, it is impossible to allow this current changing to propagate to any other coil. Therefore, it becomes difficult for a quench phenomenon to be propagated between coils by a current changing. However, there is no change in the electromagnetic coupling between coils. Therefore, like the first embodiment, it is possible to allow a quench phenomenon to propagate by electromagnetic coupling.

Fourth Embodiment

Figure 6:
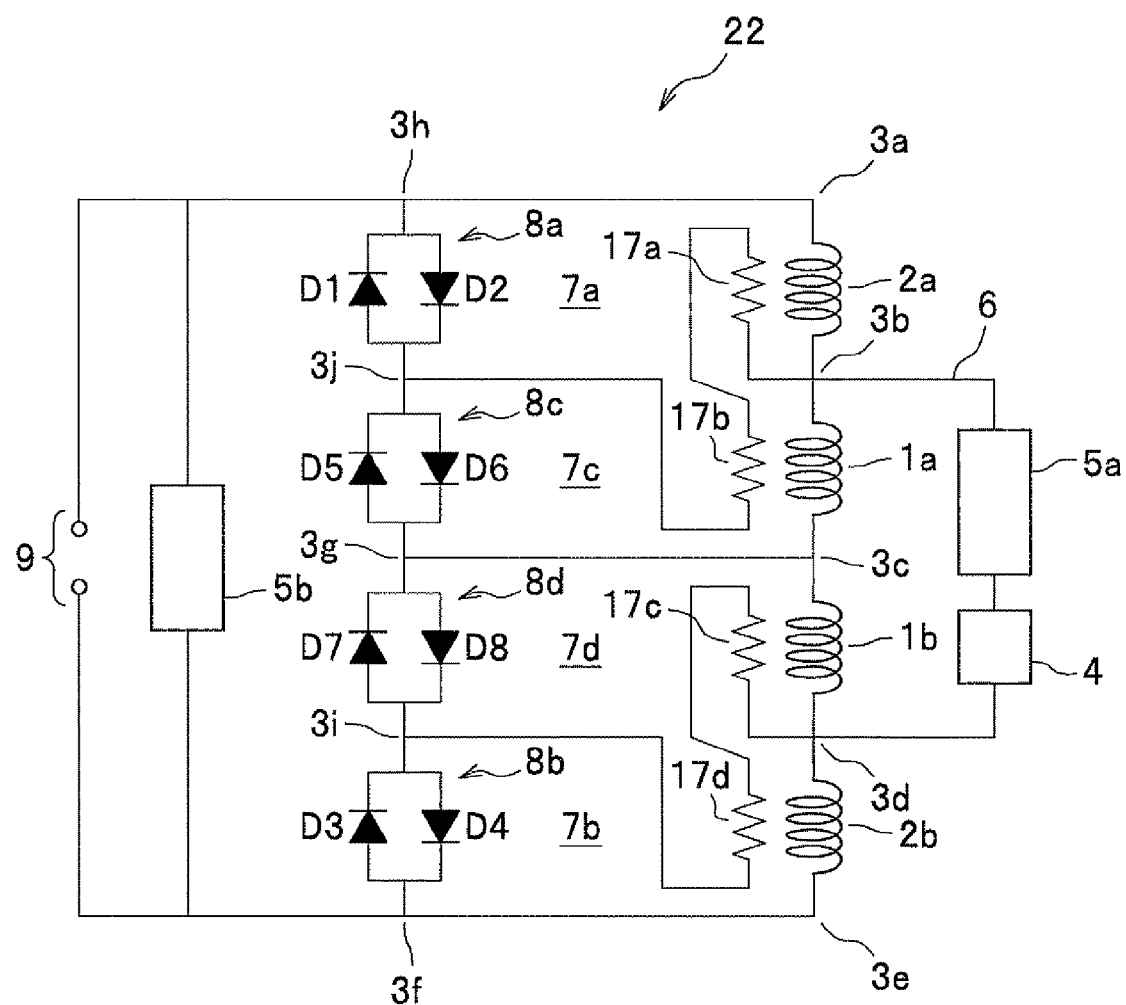
FIG. 6 is a schematic circuit diagram of an active shield superconducting electromagnet apparatus according to the fourth embodiment of the present invention.

FIG. 6 is a schematic circuit diagram of the active shield superconducting electromagnet apparatus 22 according to a fourth embodiment of the present invention. As shown in FIG.

6, the superconducting electromagnet apparatus 22 according to the fourth embodiment of the present invention differs from the superconducting electromagnet apparatus 22 of the third embodiment in that electrical resistors 17a and 17b, which serve as quench-back heaters, are provided between node 3b and node 3j, and electrical resistors 17c and 17d, which serve as quench-back heaters, are provided between node 3d and node 3i. And, relative to the large size of the first shield coil 2a, the electrical resistor 17a is arranged in the vicinity of the first shield coil 2a in thermal contact with it. Relative to the large size of the first main coil 1a, the electrical resistor 17b is arranged in the vicinity of the first main coil 1a in thermal contact with it. Relative to the large size of the second main coil 1b, the electrical resistor 17c is arranged in the vicinity of the second main coil 1b in thermal contact with it. Relative to the large size of the second shield coil 2b, the electrical resistor 17d is arranged in the vicinity of the second shield coil 2b in thermal contact with it.

In the first closed circuit 7a, the electrical resistors 17a and 17b are newly added between node 3b and node 3j. Further, with respect to the electrical resistors 17a and 17b, a current does not flow through in the absence of potential difference between both ends, and a current flows through in the presence of potential difference between both ends. This characteristic is the same as that of the first quench protection circuit 8a. From this, it may be considered that the first quench protection circuit 8a comprises the pair of bidirectional diodes D1 and D2, and the electrical resistors 17a and 17b. Further, first quench protection circuit 8a may comprise the electrical resistors 17a and 17b, and may dispense with a pair of bidirectional diodes D1 and D2. More concretely, node 3h and node 3j may be short-circuited.

In a third closed circuit 7c, the electrical resistors 17a and 17b are newly added between node 3b and node 3j. The electrical resistors 17a and 17b serve in the first closed circuit 7a and the third closed circuit 7c. And, it may also be considered that the third quench protection circuit 8c comprises the pair of bidirectional diodes D5 and D6, and the electrical resistors 17a and 17b. Further, the third quench protection circuit 8c may comprise the electrical resistors 17a and 17b, and may dispense with the pair of bidirectional diodes D5 and D6. More concretely, node 3j and node 3g may be short-circuited.

In a fourth closed circuit 7d, the electrical resistors 17c and 17d are newly added between node 3d and node 3i. And, it may also be considered that the fourth quench protection circuit 8d comprises the pair of bidirectional diodes D7 and D8, and the electrical resistors 17c and 17d. Further, the fourth quench protection circuit 8d may comprise the electrical resistors 17c and 17d, and may dispense with a pair of bidirectional diodes D7 and D8. More concretely, node 3g and node 3i may be short-circuited.

In the second closed circuit 7b, the electrical resistors 17c and 17d are newly added between node 3d and node 3i. The electrical resistors 17c and 17d serve in the fourth closed circuit 7d and the second closed circuit 7b. And, it may also be considered that the second quench protection circuit 8b comprises the pair of bidirectional diodes D3 and D4, and the electrical resistors 17c and 17d. Further, second quench protection circuit 8b may comprise the electrical resistors 17c and 17d, and may dispense with the pair of bidirectional diodes D3 and D4. More concretely, node 3i and node 3f may be short-circuited.

Hereinafter, the behavior of electrical resistors 17a-17d in the case wherein the coils 1a, 1b, 2a, and 2b are quenched will be explained. For example, the case wherein the first shield coil 2a begins to be quenched is considered. In this case, as described above, the resistance voltage is generated between node 3a and node 3b, both ends of the first shield coil 2a. Since this resistance voltage is applied between node 3j and node 3h, both ends of a pair of bidirectional diodes, either diode D1 or diode D2 will be turned on, and an on-current will flow through. As a result, a circulating current flows through the first closed circuit 7a. Since this circulating current flows through the electrical resistors 17a and 17b, the electrical resistors 17a and 17b generate heat. Since the electrical resistor 17a heats a large portion of the first shield coil 2a, it can allow a quench phenomenon generated at a localized portion of the first shield coil 2a to propagate extensively. Since the electrical resistor 17b heats a large portion of the first main coil 1a, it can allow a quench phenomenon to be generated extensively depending on heating. This provides that it is possible to allow a quench phenomenon to propagate from the first shield coil 2a to the first main coil 1a.

Further, in the second main coil 1b, an induced electromotive force is generated by the electromagnetic coupling with the first main coil 1a (mutual inductance). By this induced electromotive force, voltage is generated between node 3i and node 3g, both ends of a pair of bidirectional diodes D7 and D8, either diode D7 or diode D8 will be turned on, and an on-current will flow through. As a result, a circulating current flows through the fourth closed circuit 7d. Since this circulating current flows through the electrical resistors 17c and 17d, the electrical resistors 17c and 17d generate heat. Since the electrical resistor 17c heats a large portion of the second main coil 1b, it can allow a quench phenomenon to be generated extensively depending on heating. This provides that it is possible to allow a quench phenomenon to propagate from the first main coil 1a to the second main coil 1b. Since the electrical resistor 17d heats a large portion of the second shield coil 2b, it can allow a quench phenomenon to be generated extensively depending on heating. This provides that it is possible to allow a quench phenomenon to propagate from the first main coil 1a to the second shield coil 2b. As described above, it is possible to allow a quench phenomenon to propagate to all of the coils.

Fifth Embodiment

Figure 7:
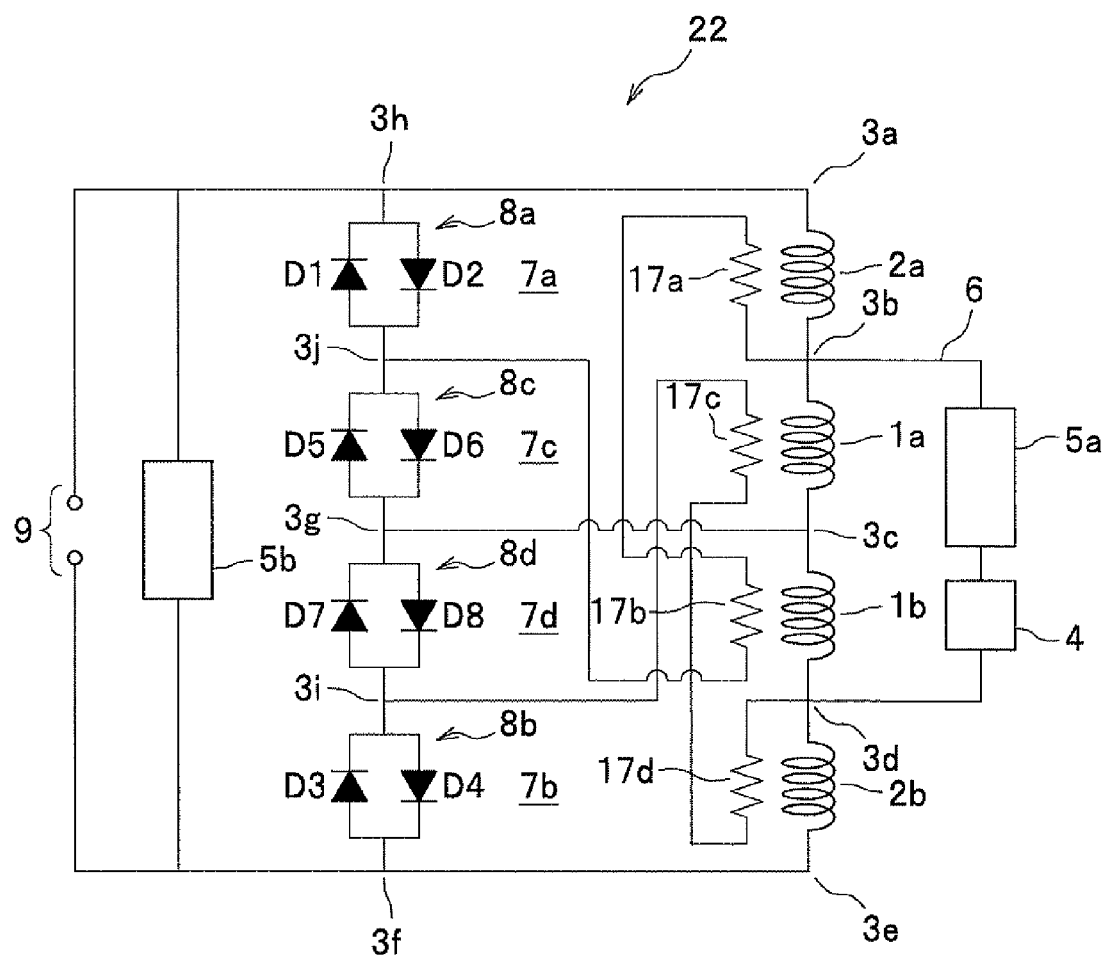
FIG. 7 is a schematic circuit diagram of an active shield superconducting electromagnet apparatus according to the fifth embodiment of the present invention.

FIG. 7 is a schematic circuit diagram of the active shield superconducting electromagnet apparatus 22 according to a fifth embodiment of the present invention. As shown in FIG. 7, the superconducting electromagnet apparatus 22 according to the fifth embodiment of the present invention differs from the superconducting electromagnet apparatus 22 of the fourth embodiment in that relative to the large size of the second main coil 1b, the electrical resistor 17b is arranged in the vicinity of the second main coil 1b (not the first main coil 1a) in thermal contact with it. Also, it differs that relative to the large size of the first main coil 1a, the electrical resistor 17c is arranged in the vicinity of the first main coil 1a (not the second main coil 1b) in thermal contact with it.

According to the fifth embodiment, even if the first main coil 1a is spaced apart from the second main coil 1b, and thereby the electromagnetic coupling (mutual inductance) is weak, for example, when the first shield coil 2a begins to be quenched, a current flows through a pair of bidirectional diodes D1 and D2 by voltage generated at the first shield coil 2a, and this current circulates through the first closed circuit 7a. And, the electrical resistors 17a and 17b generate heat. The electrical resistor 17a heats the first shield coil 2a, and the electrical resistor 17b heats the second main coil 1b. The second main coil 1b is quenched by this heating. As a result, a quench phenomenon is allowed to propagate from the first shield coil 2a to the second main coil 1b.

Also, a quench phenomenon is allowed to propagate from the first shield coil 2a to the first main coil 1a which is electromagnetically coupled to the first shield coil 2a strongly. Further, in the second shield coil 2b, the quench phenomenon is allowed to propagate via two routes, namely, heat of the electrical resistor 17d generated by a current circulation in the fourth closed circuit 7d caused by the quenched second main coil 1b, and an electromagnetic coupling caused by the quenched second main coil 1b. As described above, the quench phenomenon is allowed to propagate in all of the coils 1a, 1b, 2a, and 2b. As a result, since the electrical resistance increases in all of the coils 1a, 1b, 2a, and 2b to promote the decay of the persistent current, the resistance voltage of the coil in which quench begins can be suppressed, and the current flowing through the superconducting fault current limiter 4 in the bypass circuit 6 can be reduced.

Sixth Embodiment

Figure 8:
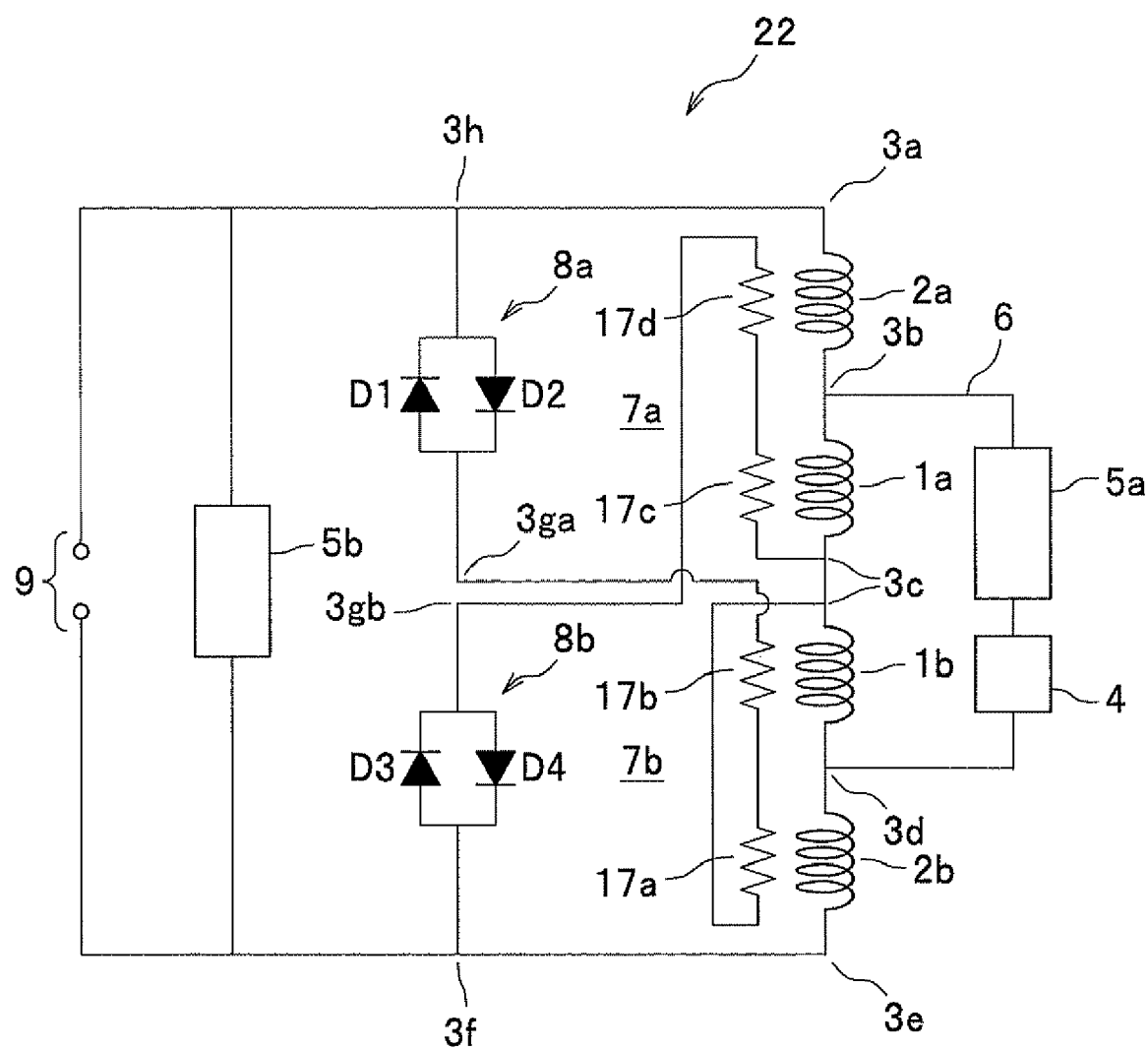
FIG. 8 is a schematic circuit diagram of an active shield superconducting electromagnet apparatus according to the sixth embodiment of the present invention.

FIG. 8 is a schematic circuit diagram of the active shield superconducting electromagnet apparatus 22 according to a sixth embodiment of the present invention. As shown in FIG. 8, the superconducting electromagnet apparatus 22 according to the sixth embodiment of the present invention differs from the superconducting electromagnet apparatus 22 of the first embodiment (see FIG. 2) in that node 3ga and node 3gb are formed at a location which corresponds to node 3g in FIG. 2. Node 3ga is directly connected to the first quench protection circuit 8a, and node 3gb is directly connected to the second quench protection circuit 8b.

And, although node 3c and node 3g are short-circuited in FIG. 2, it differs in that electrical resistors 17a and 17b are provided between node 3c and node 3ga to serve as a quench-back heater, and electrical resistors 17c and 17d are provided between node 3c and node 3gb to serve as a quench-back heater in FIG. 8. And, relative to the large size of the second shield coil 2b, the electrical resistor 17a is arranged in the vicinity of the second shield coil 2b in thermal contact with it. Relative to the large size of the second main coil 1b, the electrical resistor 17b is arranged in the vicinity of the second main coil 1b in thermal contact with it. Relative to the large size of the first main coil 1a, the electrical resistor 17c is arranged in the vicinity of the first main coil 1a in thermal contact with it. Relative to the large size of the first shield coil 2a, the electrical resistor 17d is arranged in the vicinity of the first shield coil 2a in thermal contact with it.

In the first closed circuit 7a, the electrical resistors 17a and 17b are newly added between node 3c and node 3ga. Further, with respect to the electrical resistors 17a and 17b, a current does not flow through in the absence of potential difference between both ends, and a current flows through in the presence of potential difference between both ends. This characteristic is the same as that of the first quench protection circuit 8a. From this, it may be considered that the first quench protection circuit 8a comprises the pair of bidirectional diodes D1 and D2, and the electrical resistors 17a and 17b. Further, the first quench protection circuit 8a may comprise the electrical resistors 17a and 17b, and may dispense with a pair of bidirectional diodes D1 and D2. More concretely, node 3h and node 3ga may be short-circuited.

In the second closed circuit 7b, the electrical resistors 17c and 17d are newly added between node 3c and node 3gb. And, it may be considered that the second quench protection circuit 8b also comprises a pair of bidirectional diodes D3 and D4, and the electrical resistors 17c and 17d. Further, the second quench protection circuit 8b may comprise the electrical resistors 17c and 17d, and may dispense with a pair of bidirectional diodes D3 and D4. More concretely, node 3gb and node 3f may be short-circuited.

Hereinafter, the behavior of electrical resistors 17a-17d in the case wherein the coils 1a, 1b, 2a, and 2b are quenched will be explained. For example, the case wherein the first shield coil 2a begins to be quenched is considered. In this case, as described above, the resistance voltage is generated between node 3a and node 3b, both ends of the first shield coil 2a. Since this resistance voltage is applied between node 3ga and node 3h, both ends of the pair of bidirectional diodes, either diode D1 or diode D2 will be turned on, and an on-current will flow through. As a result, a circulating current flows through the first closed circuit 7a. Since this circulating current flows through the electrical resistors 17a and 17b, the electrical resistors 17a and 17b generate heat. Since the electrical resistor 17a heats a large portion of the second shield coil 2b, it can allow a quench phenomenon to be generated extensively depending on heating. Since the electrical resistor 17b heats a large portion of the second main coil 1b, it can allow a quench phenomenon to be generated extensively depending on heating. This provides that it is possible to allow a quench phenomenon to propagate from the first shield coil 2a to the second main coil 1b and the second shield coil 2b.

Further, in the first main coil 1a, the quench phenomenon is allowed to propagate via three routes, namely, an electromagnetic coupling caused by the quenched first shield coil 2a, a current changing in the first closed circuit 7a caused by the quenched first shield coil 2a, and heat of the electrical resistor 17c generated by a current circulation in the second closed circuit 7b caused by the quenched second main coil 1b and the quenched second shield coil 2b. As described above, the quench phenomenon is allowed to propagate to all of the coils 1a, 1b, 2a, and 2b. As a result, since the electrical resistance increases in all of the coils 1a, 1b, 2a, and 2b to promote the decay of the persistent current, the resistance voltage of the coil in which quench begins can be suppressed, and the current flowing through the superconducting fault current limiter 4 in the bypass circuit 6 can be reduced.

Further, node 3ga and node 3gb may be short-circuited. By this short circuit, a serial connection of the electrical resistor 17a and the electrical resistor 17b, and a serial connection of the electrical resistor 17c and the electrical resistor 17d are connected in parallel. It is considered that the electrical resistor 17c and the electrical resistor 17d are commonly used in both the first closed circuit 7a and the second closed circuit 7b. And, the quench phenomenon is allowed to propagate to all of the coils 1a, 1b, 2a, and 2b via heat of the electrical resistors 17a-17d.

Other Embodiments

In the embodiment of the present invention, although main central axes of a pair of opposed main coils 1a and 1b are oriented in the vertical direction, they may be oriented in the horizontal direction. When the Z-axis is oriented in the horizontal direction, the direction of the magnetic field is in the horizontal direction, the direction of access to the imaging region 16 for a patient matches the direction of the magnetic field, and a cylindrical magnet can be used.

The invention claimed is:

1. An active shield superconducting electromagnet apparatus comprising:
   a main switching circuit including a first main coil, a second main coil, a first shield coil, a second shield coil, and a first superconducting persistent current switch, which are connected in series, the second main coil having the same excitation direction as that of the first main coil, and the first shield coil and the second shield coil having an excitation direction reverse to that of the first main coil;
   a sub switching circuit including a bypass circuit which is connected to a series circuit of the first main coil and the second main coil, or to a series circuit of the first shield coil and the second shield coil, in parallel,
   the bypass circuit including:
      a superconducting fault current limiter for limiting a current flowing therethrough through transition from a superconducting state to a normal conducting state when a value of the current is greater than a pre-determined value, and
      a second superconducting persistent current switch, connected to the superconducting fault current limiter in series, and
   a first closed circuit including at least one of the first main coil and the first shield coil, and a first quench protection circuit, which are connected in series,
      the first quench protection circuit allowing a current not to flow therethrough in the absence of potential difference between both ends thereof, and allowing a current to flow therethrough in the presence of potential difference between both ends thereof; and
   a second closed circuit including at least one of the second main coil and the second shield coil, and a second quench protection circuit, which are connected in series,
      each of the first and second quench protection circuits allowing a current not to flow therethrough in the absence of potential difference between both ends thereof, and allowing a current to flow therethrough in the presence of potential difference between both ends thereof,
   wherein the first main coil, the second main coil, the first shield coil, and the second shield coil have the same axis, and are arranged on the axis in order of the first shield coil, the first main coil, the second main coil, and the second shield coil, and
   wherein each of the coils are connected in series in order of the first shield coil, the second main coil, the first main coil, and the second shield coil.

2. The active shield superconducting electromagnet apparatus of claim 1,
   wherein the first quench protection circuit comprises a parallel circuit which includes anti-parallel first and second diodes, and
   wherein the second quench protection circuit comprises a parallel circuit which includes anti-parallel third and fourth diodes.

3. The active shield superconducting electromagnet apparatus of claim 1,
   wherein the first closed circuit comprises one of the first main coil and the first shield coil, and
   further comprises a third closed circuit wherein the other of the first main coil and the first shield coil, and a third quench protection circuit are connected in series, and
   wherein the third quench protection circuit allows a current not to flow therethrough in the absence of potential difference between both ends thereof, and allows a current to flow therethrough in the presence of potential difference between both ends thereof.

4. The active shield superconducting electromagnet apparatus of claim 3, wherein the third quench protection circuit comprises a parallel circuit which includes anti-parallel fifth and sixth diodes.

5. The active shield superconducting electromagnet apparatus of claim 1,
   wherein the second closed circuit comprises one of the second main coil and the second shield coil, and
   further comprises a fourth closed circuit wherein the other of the second main coil and the second shield coil, and a fourth quench protection circuit are connected in series, and
   wherein the fourth quench protection circuit allowing a current not to flow therethrough in the absence of potential difference between both ends thereof, and allowing a current to flow therethrough in the presence of potential difference between both ends thereof.

6. The active shield superconducting electromagnet apparatus of claim 5, wherein the fourth quench protection circuit comprises a parallel circuit which includes anti-parallel seventh and eighth diodes.

7. The active shield superconducting electromagnet apparatus of claim 1,
   wherein the first quench protection circuit comprises a first electrical resistor, and
   wherein the first electrical resistor is arranged in the vicinity of at least one of the first main coil, the second main coil, the first shield coil, and the second shield coil.

8. The active shield superconducting electromagnet apparatus of claim 1,
   wherein the second quench protection circuit comprises a second electrical resistor, and
   wherein the second electrical resistor is arranged in the vicinity of at least one of the first main coil, the second main coil, the first shield coil, and the second shield coil.

9. The active shield superconducting electromagnet apparatus of claim 7, wherein the first electrical resistor also serves as the second electrical resistor.

10. The active shield superconducting electromagnet apparatus of claim 3,
    wherein the third quench protection circuit comprises a third electrical resistor, and
    wherein the third electrical resistor is arranged in the vicinity of at least one of the first main coil, the second main coil, the first shield coil, and the second shield coil.

11. The active shield superconducting electromagnet apparatus of claim 7, wherein the first electrical resistor also serves as the third electrical resistor.

12. The active shield superconducting electromagnet apparatus of claim 5,
    wherein the fourth quench protection circuit comprises a fourth electrical resistor, and
    wherein the fourth electrical resistor is arranged in the vicinity of at least one of the first main coil, the second main coil, the first shield coil, and the second shield coil.

13. The active shield superconducting electromagnet apparatus of claim 8, wherein the second electrical resistor also serves as the fourth electrical resistor.

14. A magnetic resonance imaging system
    wherein the active shield superconducting electromagnet apparatus according to claim 1 is used, and
    wherein a gap is provided between the first main coil and the second main coil, the gap is at atmospheric pressure and normal temperature, and is used as an imaging region.

* * * * *